United States Patent
Mimuro

(10) Patent No.: US 9,818,832 B2
(45) Date of Patent: Nov. 14, 2017

(54) SEMICONDUCTOR DEVICE

(71) Applicant: SEIKO INSTRUMENTS INC., Chiba-shi, Chiba (JP)

(72) Inventor: Yoichi Mimuro, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/927,056

(22) Filed: Oct. 29, 2015

(65) Prior Publication Data
US 2016/0126313 A1    May 5, 2016

(30) Foreign Application Priority Data
Nov. 4, 2014   (JP) .................................. 2014-224330

(51) Int. Cl.
*H01L 29/66* (2006.01)
*H01L 29/423* (2006.01)
*H01L 29/78* (2006.01)
*H01L 29/08* (2006.01)

(52) U.S. Cl.
CPC .. *H01L 29/42368* (2013.01); *H01L 29/66659* (2013.01); *H01L 29/7835* (2013.01); *H01L 29/0847* (2013.01)

(58) Field of Classification Search
CPC ............. H01L 29/1083; H01L 29/4238; H01L 29/0878; H01L 29/7816; H01L 29/66681; H01L 29/42368; H01L 29/7835; H01L 29/66659
USPC ......................................................... 257/339
See application file for complete search history.

(56) References Cited

U.S. PATENT DOCUMENTS

| | | | | |
|---|---|---|---|---|
| 5,366,916 A | * | 11/1994 | Summe | H01L 21/82385 257/369 |
| 2009/0167662 A1 | * | 7/2009 | Kao | H01L 27/088 345/90 |
| 2010/0102386 A1 | * | 4/2010 | You | H01L 29/0878 257/336 |

OTHER PUBLICATIONS

Abstract, Publication No. 2002-329728, Publication Date Nov. 15, 2002.

* cited by examiner

*Primary Examiner* — Trung Q Dang
(74) *Attorney, Agent, or Firm* — Adams & Wilks

(57) ABSTRACT

Provided is an integrated circuit having a LOCOS-drain type MOS transistor mounted thereon in which, even in the case of poor pattern formation, a withstand voltage is not lowered and a poor withstand voltage does not result. A drain oxide film thicker than a gate oxide film is formed on an active region on a drain side of the LOCOS-drain type MOS transistor, to thereby prevent the withstand voltage of the MOS transistor from being lowered even if the gate electrode reaches the active region on the drain side.

6 Claims, 4 Drawing Sheets

SEMICONDUCTOR DEVICE

BACKGROUND OF THE INVENTION

1. Field of the Invention

The present invention relates to a semiconductor device including a MOS semiconductor element, and in particular, to a semiconductor device including a MOS semiconductor element having a high withstand voltage.

2. Description of the Related Art

In order to realize a high drain withstand voltage in a MOS semiconductor element having a MOS transistor structure of a semiconductor device, an electric field in the vicinity of the drain needs to be relaxed. One method of realizing electric field relaxation in the vicinity of a drain is to form a so-called LOCOS-drain type MOS transistor in which a thick oxide film (field oxide film) is formed by LOCOS in the vicinity of the drain.

FIG. 2 is a sectional view of a LOCOS-drain type MOS transistor. A heavily doped n-type diffusion layer 5 serving as a source region and a medium doped n-type diffusion layer 2 serving as a drain region are formed in a surface of a p-type silicon substrate 1 so as to be separated from each other. If a thick gate oxide film is formed in a channel region between the heavily doped n-type diffusion layer 5 and the medium doped n-type diffusion layer 2, current drivability is lowered, and thus, instead of the thick gate oxide film, a thin gate oxide film 6A is formed. A LOCOS oxide film 7, which is a thick oxide film, is formed on the medium doped n-type diffusion layer 2 serving as the drain region. A gate electrode 8 is formed so as to extend from the thin gate oxide film 6A on the channel region to the LOCOS oxide film 7. A heavily doped n-type diffusion layer 4 is formed adjacent to the medium doped n-type diffusion layer 2 for connection to a metal layer, and a thin oxide film on a drain (hereinafter referred to as drain oxide film) 6B is formed on a surface of the heavily doped n-type diffusion layer 4.

There are cases in which a lightly doped n-type diffusion layer 3 is further formed under the medium doped n-type diffusion layer 2 and the heavily doped n-type diffusion layer 4 serving as the drain region. The lightly doped n-type diffusion layer 3 may be formed as an n-type well region. The LOCOS oxide film 7 is formed primarily for the purpose of isolating elements, and is, in this case, applied to a drain of a high withstand voltage MOS transistor, which is a method of realizing a high withstand voltage MOS transistor without increasing the number of manufacturing steps. Note that, in FIG. 2, a region denoted as N+ means that the region has an impurity concentration higher than that of a region denoted as N±. A region denoted as N± means that the region has an impurity concentration higher than that of a region denoted as NWELL.

Various attempts have been made to a LOCOS-drain type MOS transistor, such as reduction of fluctuations in drain withstand voltage (see, for example, Japanese Patent Application Laid-open No. 2002-329728).

In designing an integrated circuit having a LOCOS-drain type MOS transistor mounted thereon, it is desired that the length of the LOCOS oxide film 7 in a channel direction in the vicinity of a drain be as short as possible. However, if the length is small, when a polysilicon film serving as a gate electrode is patterned in a process of manufacturing the integrated circuit, misalignment may be produced to form an undesirable pattern.

FIG. 3 is an illustration of such poor pattern formation. A gate electrode 8 formed of a polysilicon film should come up to a flat portion of an upper surface of the LOCOS oxide film 7. In the case of poor pattern formation, the gate electrode 8 is sometimes located beyond the LOCOS oxide film 7 to reach a thin drain oxide film 6B formed on the heavily doped region 4 on a drain side. A reference numeral 12 in FIG. 3 designates such a gate electrode that extends to the thin drain oxide film 6B. A large potential difference is applied between the drain region and the gate electrode. In such a structure, the drain oxide film 6B under the gate electrode that reaches the heavily doped region 4 on the drain side is thin and has only a low withstand voltage, and thus, the LOCOS-drain type MOS transistor cannot have a withstand voltage that is originally desired, resulting in a poor withstand voltage.

SUMMARY OF THE INVENTION

Accordingly, an object of the present invention is to provide a semiconductor device including a MOS semiconductor element that has a MOS transistor structure in which a withstand voltage is not lowered even when an undesirable pattern as described above is formed.

In order to solve the problem described above, according to one embodiment of the present invention, a drain oxide film thicker than a gate oxide film is formed on a heavily doped region on a drain side of a LOCOS-drain type MOS transistor.

According to the one embodiment of the present invention, even in the case of a poor pattern, a withstand voltage of the drain oxide film under a gate electrode that reaches an active region of the drain is not lowered. Even in the case of a poor pattern, the withstand voltage is not lowered, and thus, yields become stable. Further, even in the case of a poor pattern, deterioration over time of dielectric strength in continuous use can be avoided to reduce a failure due to the deterioration over time.

DETAILED DESCRIPTION OF THE EMBODIMENT

Figure 1:
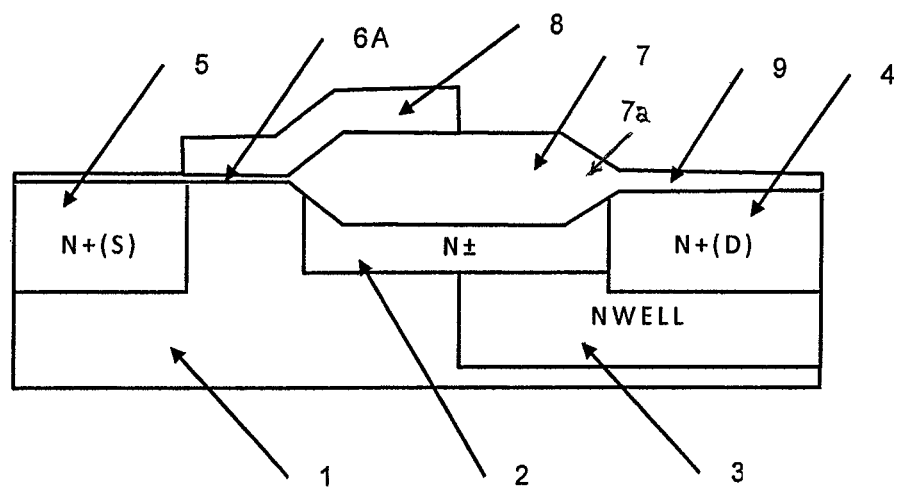
FIG. 1 is a schematic sectional view of a LOCOS-drain type MOS transistor according to an embodiment of the present invention.
Figure 2:
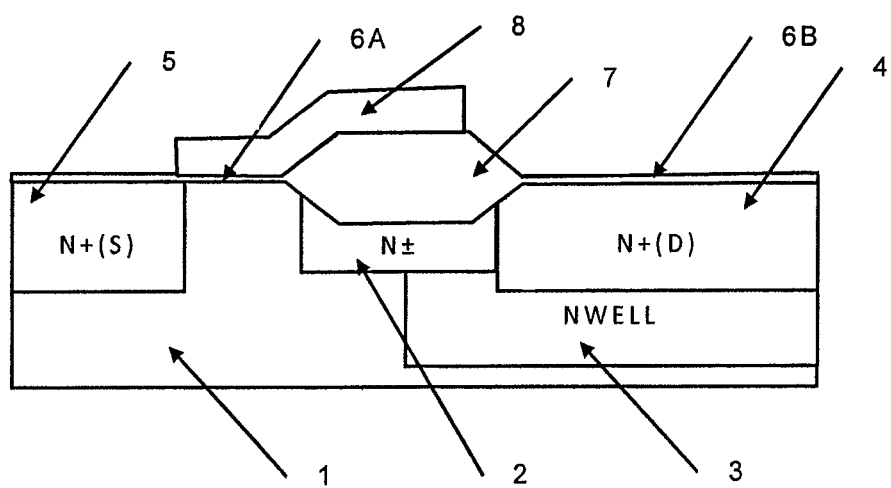
FIG. 2 is a schematic sectional view of a related-art LOCOS-drain type MOS transistor.
Figure 3:
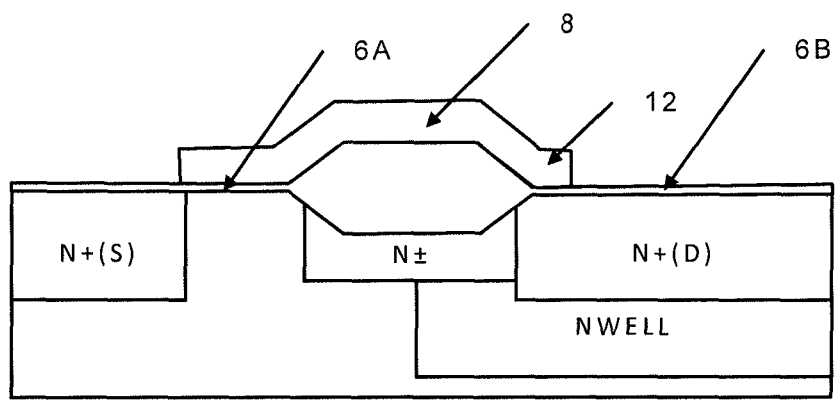
FIG. 3 is a schematic sectional view of a related-art LOCOS-drain type MOS transistor when a poor pattern is formed.

FIG. 1 is a schematic sectional view of a LOCOS-drain type MOS transistor according to an embodiment of the present invention. A heavily doped n-type diffusion layer 5 serving as a source region and a medium doped n-type diffusion layer 2 serving as a drain region are formed in a surface of a p-type silicon substrate 1 so as to be separated from each other. A relatively thin gate oxide film 6A is formed in a channel region between the heavily doped n-type diffusion layer 5 and the medium doped n-type diffusion layer 2. The reason is that, if a thick gate oxide film is formed, current drivability is lowered. As illustrated in FIGS. 1 and 4B (described later), the LOCOS oxide film 7 has a bird's beak region 7a around its periphery. Successively with a formation of the gate oxide film 6A, a LOCOS oxide film 7 as a thick oxide film is formed on the medium doped n-type diffusion layer 2 serving as the drain region. The reason is that a strong electric field is applied to the oxide film at an end portion of the drain region on the channel side, which should be withstood. Then, a gate electrode 8 is formed above the channel region so as to extend from the thin gate oxide film 6A to a flat portion of the LOCOS oxide film 7.

A heavily doped n-type diffusion layer 4 is formed adjacent to the medium doped n-type diffusion layer 2 serving as the drain region for connection to a metal layer serving as wiring, and a drain oxide film 9 thicker than the thin gate oxide film 6A is formed contiguous to the bird's beak region 7a of the LOCOS oxide film 7 on a surface of the heavily doped n-type diffusion layer 4. The LOCOS oxide film 7 is not formed on the surface of the heavily doped n-type diffusion layer 4, and thus, an active region of the drain is formed. In this case, the drain oxide film 9 has a thickness with which the drain oxide film 9 is not broken down by a maximum potential difference applied between the gate electrode 8 and the drain region in normal operation. There are cases in which a lightly doped n-type diffusion layer 3 is further formed under the medium doped n-type diffusion layer 2 and the heavily doped n-type diffusion layer 4 serving as the drain region. The lightly doped n-type diffusion layer 3 may be formed as an n-type well region.

As described above, in this embodiment, the drain oxide film 9 formed on the surface in the heavily doped region 4 on the drain side successively with a formation of the LOCOS oxide film 7 is thicker than the thin gate oxide film 6A formed on the channel region. Note that, as illustrated in FIG. 1, the drain oxide film 9 is thinner than the LOCOS oxide film 7.

In such a structure, even when the patterned gate electrode 8 is misaligned and the gate electrode 8 is located beyond the LOCOS oxide film 7 to reach the drain oxide film 9 formed on the heavily doped region 4 on the drain side, the drain oxide film 9 is thick enough that the drain oxide film 9 is not broken down by the maximum potential difference applied between the gate electrode 8 and the drain region in normal operation, and thus, the fear of electrostatic breakdown can be reduced to maintain the reliability.

When a length of the LOCOS oxide film 7 in a channel direction is extremely small, it is preferred that the gate electrode 8 overlap the LOCOS oxide film 7 by ½ or more of the length of the LOCOS oxide film in the channel direction so that, even if the gate electrode 8 is misaligned, the gate electrode 8 may cover the channel region and an offset may not be formed. In other words, it is preferred that a half or more of the LOCOS oxide film 7 be covered with the gate electrode 8.

Figure 4A:
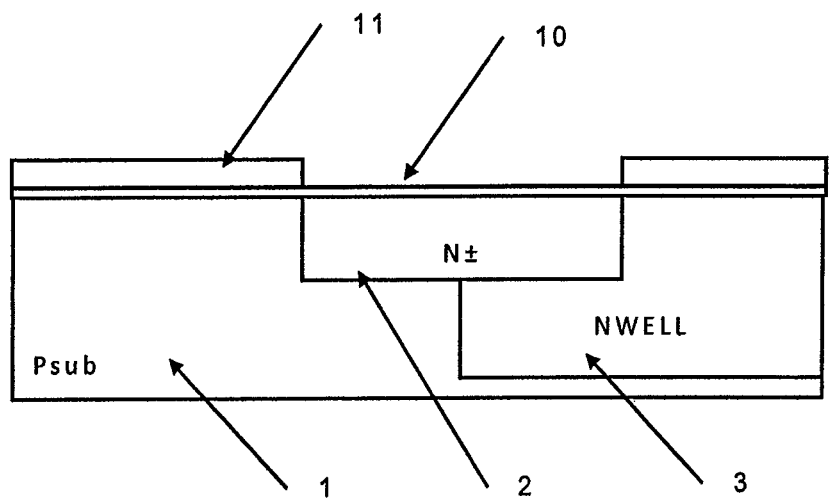
FIG. 4A to FIG. 4D are schematic sectional views for illustrating manufacturing steps of the LOCOS-drain type MOS transistor according to the embodiment of the present invention.
Figure 4B:
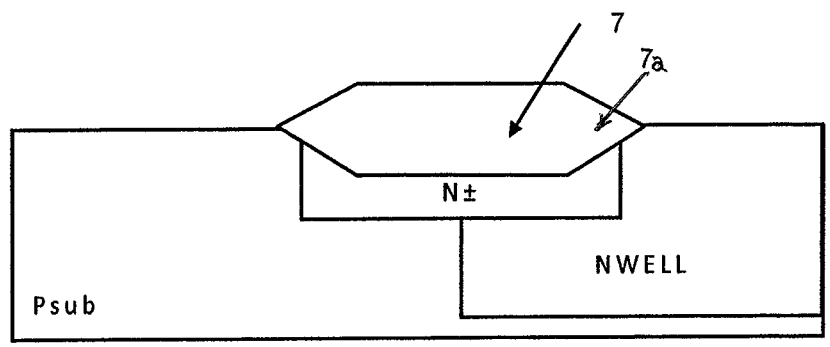

FIG. 4A to FIG. 4D are illustrations of manufacturing steps of the embodiment illustrated in FIG. 1. As illustrated in FIG. 4A, first, the lightly doped n-type diffusion layer 3 is formed on the p-type silicon substrate 1. Then, a silicon oxide film 10 and a silicon nitride film 11 are formed in sequence. After that, patterning is carried out to etch out only a portion of the silicon nitride film 11 in which the LOCOS oxide film 7 is to be formed. The medium doped n-type diffusion layer 2 is formed in the portion. Then, LOCOS oxidation is carried out to form the LOCOS oxide film 7.

After the LOCOS oxide film 7 is formed, the silicon nitride film 11 and the silicon oxide film 10 formed thereunder are removed to obtain a structure illustrated in FIG. 4B.

Figure 4C:
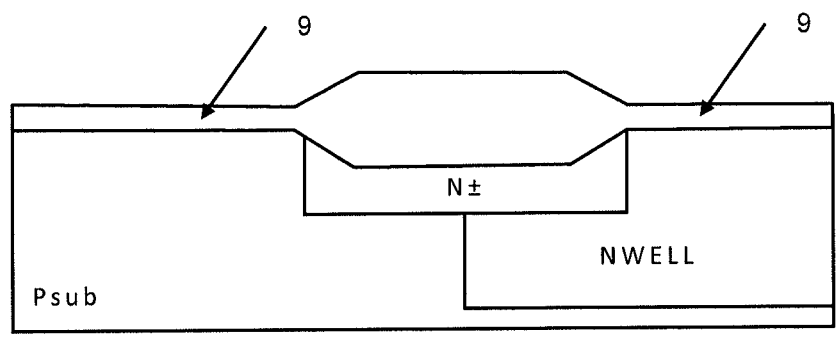

Then, as illustrated in FIG. 4C, an oxide film serving as the drain oxide film 9 is formed in a region of a high withstand voltage MOS semiconductor element that is not covered with the LOCOS oxide film 7. The oxide film has a thickness that is determined so that a withstand voltage higher than a drain withstand voltage is obtained. For example, when the drain withstand voltage is 25 V, the thickness of the thick gate oxide film is on the order of 300 Å.

Figure 4D:
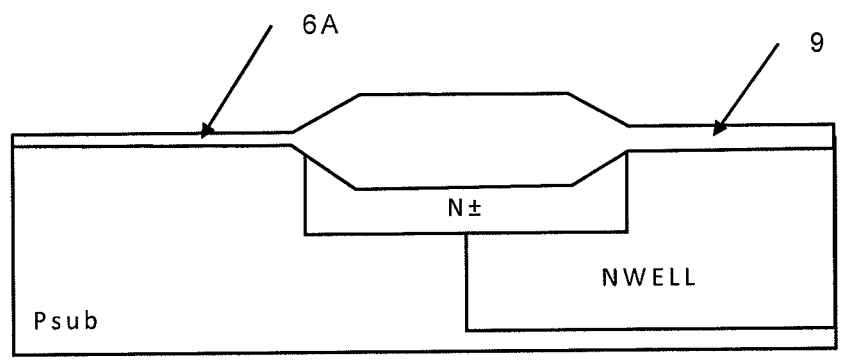

Then, as illustrated in FIG. 4D, only a portion of the drain oxide film 9 on the source region serving as a source side active region and on the channel region is etched to form the gate oxide film 6A that is thinner than the drain oxide film 9. The gate oxide film 6A has a thickness that is determined by target values of the current drivability and the drain withstand voltage. Then, a polysilicon film is formed and patterned to form the gate electrode 8, and the heavily doped n-type diffusion layers 4 and 5 serving as the heavily doped source region and drain region, respectively, are formed. In this way, the MOS semiconductor element illustrated in FIG. 1 is formed.

What is claimed is:

1. A semiconductor device including a MOS transistor, the MOS transistor comprising:
    a gate oxide film formed on a surface of a channel region;
    a LOCOS oxide film thicker than the gate oxide film and formed contiguous to the gate oxide film on a drain side;
    a gate electrode formed on the gate oxide film and the LOCOS oxide film; and
    a drain oxide film thicker than the gate oxide film and thinner than the LOCOS oxide film, the drain oxide film being separate from the LOCOS oxide film and being formed on a surface of an active region and extending from the LOCOS oxide film on a side opposite to the channel region,
    wherein the LOCOS oxide film has a bird's beak region, and the drain oxide film is contiguous to the bird's beak region and covers most of the surface of the active region.

2. A semiconductor device according to claim 1, wherein the drain oxide film has a withstand voltage higher than a withstand voltage of the drain.

3. A semiconductor device according to claim 1, wherein the gate electrode overlaps the LOCOS oxide film by ½ or more of a length of the LOCOS oxide film in a channel direction.

4. A semiconductor device according to claim 1, further comprising a drain region and a source region formed in a surface of a substrate in spaced apart relationship from one another at opposite ends of the channel region, the LOCOS oxide film being formed on the drain region.

5. A semiconductor device according to claim 4, wherein the gate oxide film is formed on both the source region and the channel region.

6. A semiconductor device according to claim 1, further comprising a drain region located beneath, and covered by, the LOCOS oxide film; and a diffusion layer adjacent to the drain region, the diffusion layer constituting the active region.

* * * * *